(12) United States Patent
Baecker

(10) Patent No.: US 7,964,533 B2
(45) Date of Patent: Jun. 21, 2011

(54) METHOD FOR PRODUCING AN HTSC STRIP

(75) Inventor: Michael Baecker, Köln (DE)

(73) Assignee: Zenergy Power GmbH, Rheinbach (DE)

( * ) Notice: Subject to any disclaimer, the term of this patent is extended or adjusted under 35 U.S.C. 154(b) by 797 days.

(21) Appl. No.: 12/031,939

(22) Filed: Feb. 15, 2008

(65) Prior Publication Data
US 2010/0279875 A1  Nov. 4, 2010

(30) Foreign Application Priority Data

Feb. 15, 2007 (DE) .......................... 10 2007 007 567

(51) Int. Cl.
*H01B 13/00* (2006.01)
*H01L 39/24* (2006.01)
*F27B 9/28* (2006.01)

(52) U.S. Cl. ........ 505/500; 505/300; 505/430; 505/704; 505/725; 505/230; 29/599; 174/125.1

(58) Field of Classification Search ............ 505/500, 505/430, 704, 230, 742; 427/62, 226; 174/125.1; 29/599; 439/59, 200
See application file for complete search history.

(56) References Cited

U.S. PATENT DOCUMENTS

| | | | |
|---|---|---|---|
| 5,747,099 A * | 5/1998 | Blaugher | 427/62 |
| 6,797,313 B2 | 9/2004 | Fritzemeier et al. | |
| 2002/0082171 A1 | 6/2002 | Schoop | |
| 2003/0127051 A1 * | 7/2003 | Fritzemeier et al. | 118/715 |
| 2005/0127133 A1 * | 6/2005 | Selvamanickam | 228/101 |

FOREIGN PATENT DOCUMENTS
EP 1705720 A 3/2009
* cited by examiner

*Primary Examiner* — Stanley Silverman
*Assistant Examiner* — Kallambella Vijayakumar
(74) *Attorney, Agent, or Firm* — Edell, Shapiro & Finnan, LLC

(57) ABSTRACT

The invention relates to a method for producing a high temperature superconductor (HTSC) from a strip including an upper side precursor layer and which, for continuous sintering of the precursor layer within a furnace in the presence of a fed-in reaction gas, is drawn across a support. A furnace for performing the method is also described.

9 Claims, 4 Drawing Sheets

METHOD FOR PRODUCING AN HTSC STRIP

CROSS REFERENCE TO RELATED APPLICATIONS

This application claims priority under 35 U.S.C. §119 to Application No. DE 102007007567.9 filed on Feb. 15, 2007, entitled "Method for Producing an HTSC Strip," the entire contents of which are hereby incorporated by reference.

FIELD OF THE INVENTION

The invention relates to a method for producing a high temperature superconductor (HTSC) from a strip which has an upper side precursor layer, wherein the strip is drawn across a support for continuous sintering of the strip within a furnace in the presence of a fed-in reaction gas.

BACKGROUND OF THE INVENTION

In a conventional process for preparing a multi-layer superconductor article, a reactor (e.g., a tube furnace) includes a housing having an upper wall with passages (e.g., slots or nozzles) that are in fluid communication with gas mixture sources (e.g., oxygen, water, and one or more inert gases (e.g., nitrogen, argon, helium, krypton, xenon). A substrate, which is wound around reels, moves through reactor in a predetermined direction.

As a substrate enters the reactor, it passes through a various regions within the reactor, during which time the gas mixture is directed downward, toward substrate. A film containing a precursor (e.g., a superconductor precursor film containing barium fluoride and/or additional materials, such as CuO and/or $Y_2O_3$) is present on the surface of substrate, moving through the regions of the reactor. The precursor is exposed to the gas mixture, reacting therewith. Spent reaction gas is drawn-off by a pump that directs the spent gas through a through a porous material positioned adjacent the passages (the slots or nozzles) in the upper wall.

In the conventional system using the above process, fresh and used reaction gases are mixed without control. This, in turn, leads to impairment of quality of the HTSC layer and/or long retention times of the strip in the furnace. Thus, it would be desirable to develop an HTSC formation method that controlled to level of mixing between the fresh and used reaction gases.

OBJECTS AND SUMMARY OF THE INVENTION

One object of the invention is to provide a method of forming a strip-shaped HTSC of constant high quality. Another object of the invention is to provide a reactor/furnace for performing a method of this kind. The above and still further objects, features, and advantages of the present invention will become apparent upon consideration of the following descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

In accordance with the invention, a strip having a precursor layer is drawn across a porous support through which fresh reaction gas is continuously fed. The continuous feeding forms a laminar flow of the fresh reaction gas above the porous support and along the sides of the strip. A vortex zone forms above the strip in the flow shadow of the strip. In the boundary region between the vortex zone and the regions of laminar flow adjacent/lateral to the vortex zone, a continuous exchange of gas takes place between the vortex zone and the laminar flow. As a result, the vortex zone is always sufficiently enriched with fresh reaction gas. In this manner, the vortices ensure good mixing of fresh and used reaction gas. Thus, provision is made for the precursor layer to be uniformly and sufficiently subjected to a flow of reaction gas during the sintering.

DETAILED DESCRIPTION OF THE INVENTION

Figure 1:
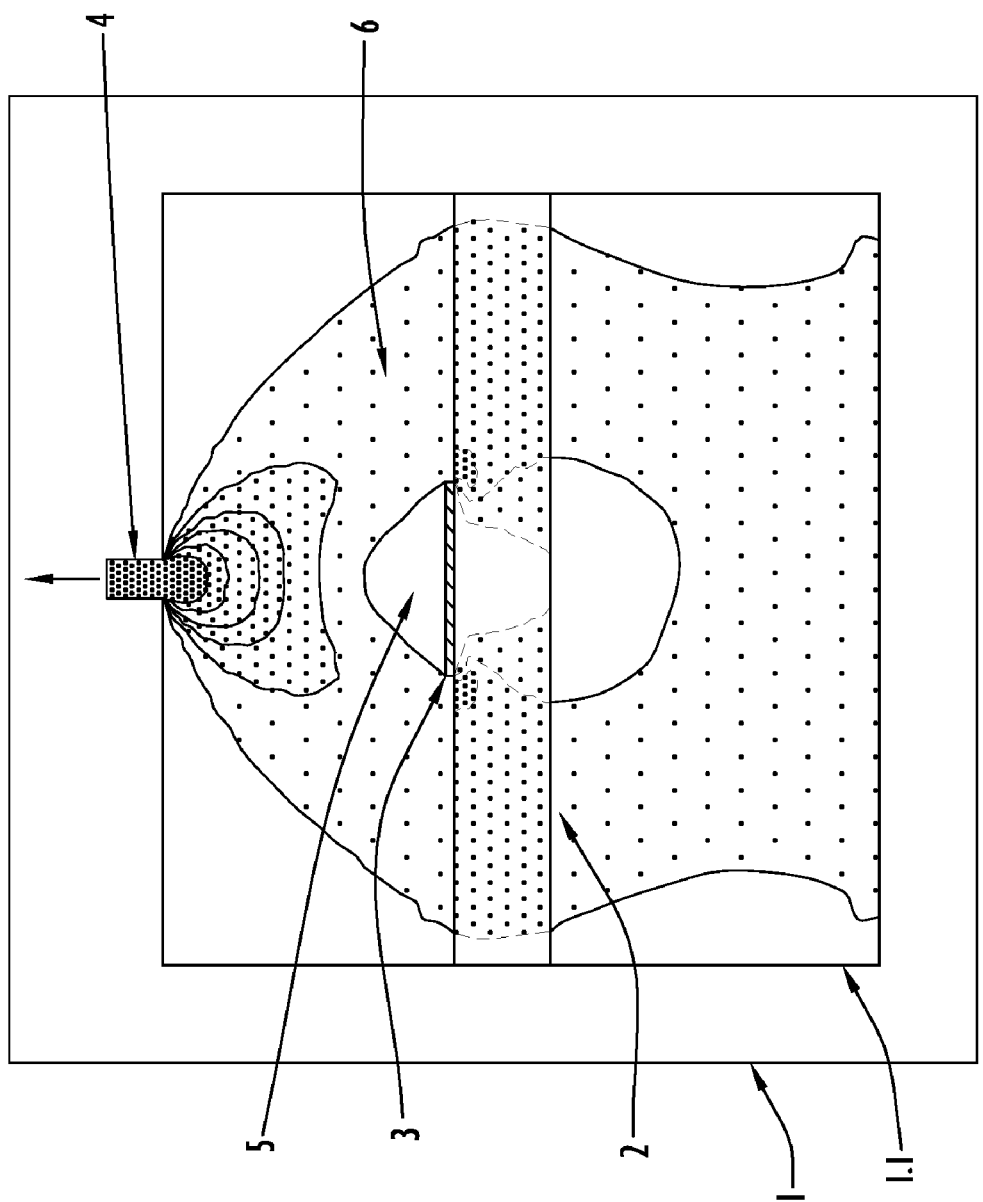
FIG. 1 illustrates a cross sectional view of a furnace in accordance with an embodiment of the invention.

FIG. 1 is a cross-sectional view of a system in accordance with an embodiment of the invention. As illustrated, the system includes a furnace 1 with a furnace space defined by a furnace inner wall 1.1. Within the furnace space is a porous support 2 such as a porous plate. The support 2 is adapted to be raised and lowered within the furnace space. Both of the side/outer edges of the support 2 are generally flush with the furnace inner wall 1.1. A substrate or strip 3 having on its upper side a precursor layer may be positioned onto the support 2. For example, the strip 3 may be drawn across the support 2 orthogonally to the cross-section plane (e.g., it may be drawn from left to right across the support from the perspective of FIG. 1). The furnace 1 further includes at least one exhaust opening 4 formed in the furnace inner wall 1.1. The exhaust opening may be centrally located above the strip 1. The exhaust opening 4 is in fluid communication with the furnace space, and, as such, is configured to remove reaction gas from the furnace space.

Figure 2:
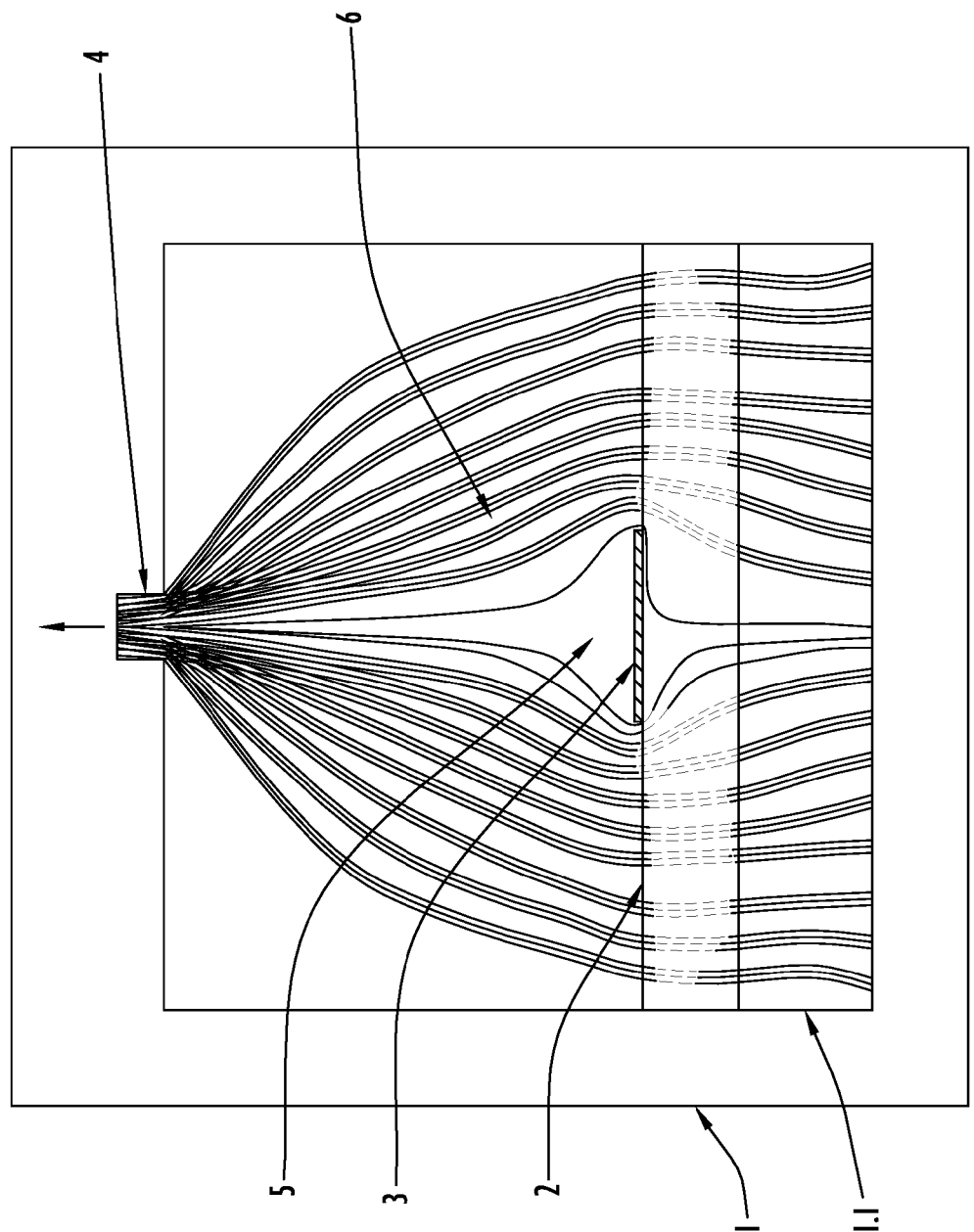
FIG. 2 illustrates the fluid flow pattern within the furnace of FIG. 1, showing the substrate support oriented in a lowered position.
Figure 3:
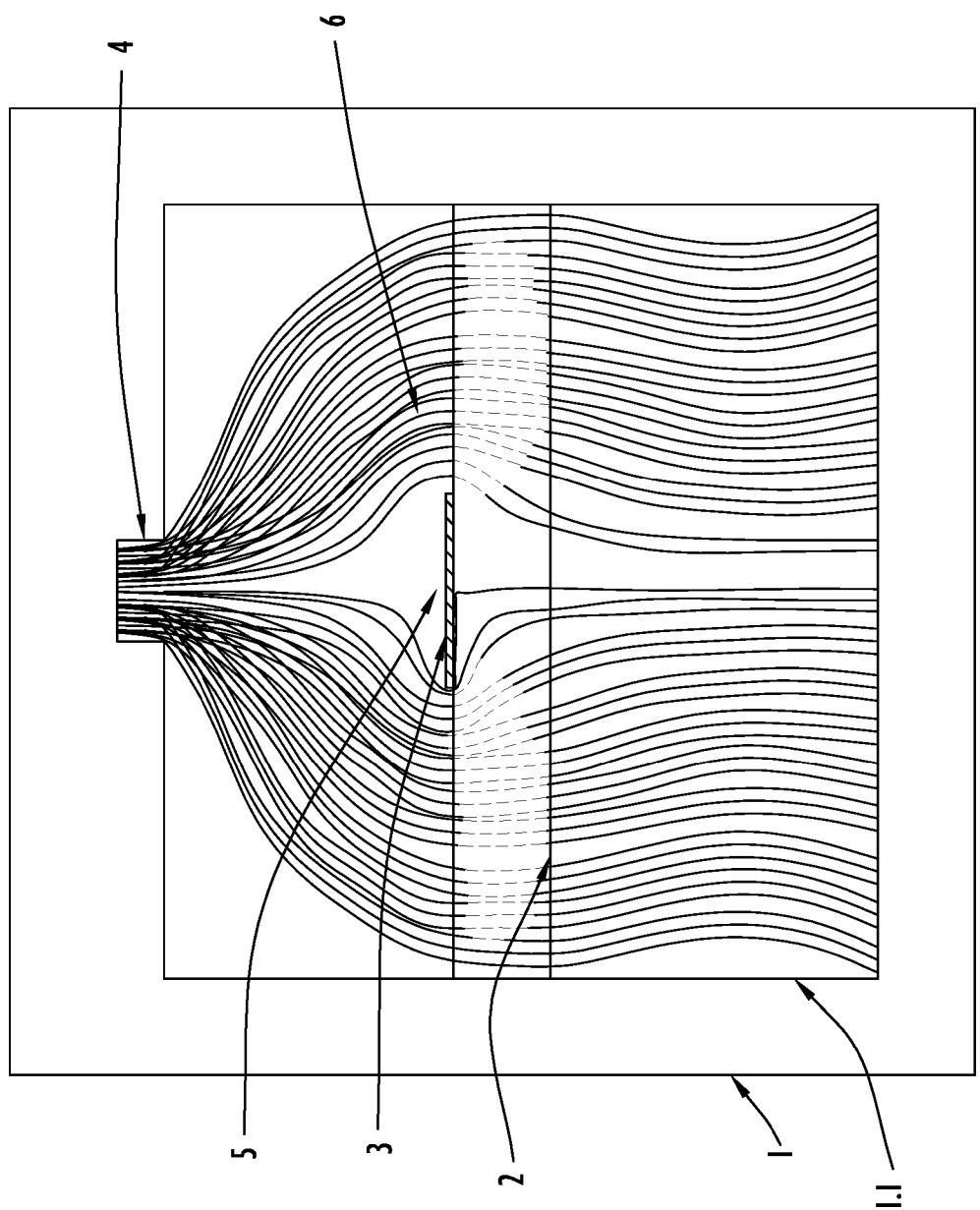
FIG. 3 illustrates the fluid flow pattern within the furnace of FIG. 1, showing the substrate support oriented in a mid-height position.
Figure 4:
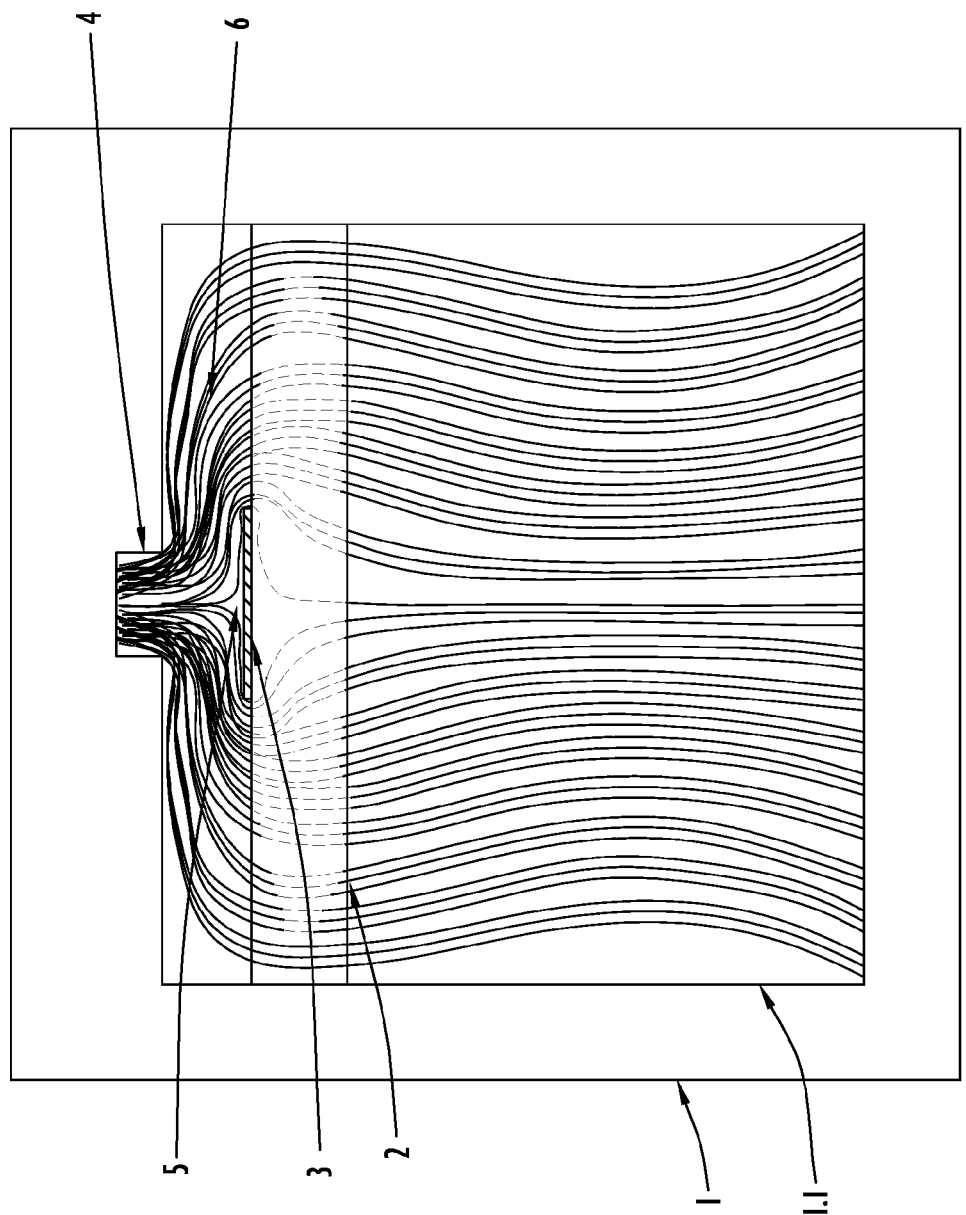
FIG. 4 illustrates the fluid flow pattern within the furnace of FIG. 1, showing the substrate support oriented in a raised position.

Referring to FIGS. 2-4, in operation, reaction gas is fed into the furnace 1 at a point below the support 2. The air travels toward the lower surface of the support 2, passing through its pores and around the strip 3 with an HTSC precursor layer disposed on the upper surface of the support. This feeding creates a substantially laminar flow 6 towards the exhaust opening 4, above the support 2 and proximate the sides of the strip 3. A vortex zone 5 of an approximately onion-shaped cross-section is formed above the strip 3 within its flow shadow.

Thus, the continuous feeding of fresh reaction gas forms a laminar flow 6 above the porous support and along the sides of the strip 3. The vortex zone 5 forms above the strip 3 in the flow shadow of the strip. In the boundary region between the vortex zone 5 and the regions of laminar flow 6 adjacent/lateral to the vortex zone, a continuous exchange of gas takes place between the vortex zone and the laminar flow. As a result, the vortex zone 5 is always sufficiently enriched with fresh reaction gas. In this manner, the vortices ensure good mixing of fresh and used reaction gas.

The support 2 may further be adapted to raise and lower to predetermined positions within the furnace space. As best seen in FIGS. 2-4, the support 2 may begin in a first position (FIG. 2) and be raised to a second position (FIG. 3) and/or a third position (FIG. 4). Conversely, the support 2 may be lowered from the third position to either the first or second positions. In this manner, the distance between the strip 3 and the exhaust opening 4 can be varied by raising and lowering the support 2. The height at which the support may be positioned is not particularly limited.

With a constant volume flow of the reaction gas, the size and shape of the vortex zone 5 (and thus the flow velocity in the vicinity of the precursor layer and the degree of gas exchange between the vortex zone and the region of laminar flow 6) can be adjusted.

Since part of the reaction gas fed into the porous support 2 does not partake in an exchange with the vortex zone 5, it is preferred to conduct the reaction gas in a circuit, feeding it into the support several times (e.g., the gas may be intermittently fed into the furnace and through the support). Used reaction gas is removed from the circuit and replaced by fresh reaction gas.

Before being fed into the support 2, the reaction gas may be heated to a predetermined temperature, e.g., to at least to about the sintering temperature. By way example, when the gas has a temperature slightly above the sintering temperature, the gas will heat the strip 3 to the sintering temperature.

Similarly, at least a portion of the support 2 may be heated to a predetermined temperature. By way of example, the region of the support 2 facing the entry side of the strip 3 into the furnace 1 may be heated. Heating the support 2 serves to heat the strip 3 rapidly to the sintering temperature.

A plurality of strips 3 may be drawn through the furnace in parallel and preferably spaced from each other. The spacing between the strips 3 preferably should be dimensioned so that a vortex zone 5 is formed above each strip. In this way, a plurality of strips 3 may be sintered simultaneously, with each strip being sufficiently and uniformly subjected to a flow of reaction gas.

Friction between the support 2 and the strip 3 may be reduced by directing gas of sufficient pressure between the support and the strip. In other words, the volume flow or the pressure of the gas fed into the support 2 can be adjusted so that reaction gas also emerges between the strip 3 and the support 2, thereby reducing the friction occurring between the support 2 and the strip 3. The strip 3 can then be drawn across the support 2 more easily, and less abraded matter is formed. This helps to inhibit blockage of the pores of the support, since fine abraded matter would be fed together with the circulating gas into the support 2 and block the pores thereof, at least after some time.

Preferably, the furnace 1 has at least one suction or vacuum means disposed above the support 2 for conducting-away reaction gas. The suction means, e.g., an exhaust mechanism, may extend parallel to the direction of drawing-through the strip 3. It is particularly preferred to draw-off the reaction gas above the strip or strips 3. This causes the cross-section of the vortex zone to become generally onion-shaped. The size of the vortex zone 5, the flow conditions within the vortex zone, and the gas exchange between the vortex zone and the laminar flow can be adjusted by the position and the shape of the exhaust openings 4.

With exhaust openings 4 disposed to be parallel to the direction of drawing-through, an average concentration of fresh reaction gas that is substantially constant along the direction of drawing-through is obtained in the vortex zone 5.

The flow of the reaction gas may be controlled particularly well when the exhaust openings 4 are slits that extend parallel to the direction of drawing-through, and/or when each strip drawn through the furnace is provided with its own row of exhaust openings disposed in parallel with the direction of drawing-through.

Thus, to perform the above-described method, a sintering furnace 1 is suitable that comprises a porous support 2 as a rest for a strip with an HTSC precursor layer, and at least one inlet and at least one outlet for a reaction gas. The support 2 communicates with the inlet for the reaction gas. Consequently, the reaction gas flows into the support 2 and/or around the sides of the support, ultimately flowing around the strip 3 as described above.

I claim:

1. A method of forming a high temperature superconductor in a furnace comprising:
   (a) providing at least one substrate having a first surface and a second surface, wherein the first surface comprises a precursor layer;
   (b) receiving a porous support within the furnace;
   (c) drawing the at least one substrate through the furnace and across the porous support such that the second surface is positioned over the support;
   (d) feeding a reaction gas into the support to form a vortex zone above the precursor layer; and
   (e) continuously sintering the precursor layer in the presence of the reaction gas.

2. The method of claim 1, wherein (d) comprises: feeding reaction gas and fresh gas into the support at predetermined intervals to from the vortex zone.

3. The method of claim 1, further comprising (f) heating the reaction gas to a predetermined temperature.

4. The method of claim 1, wherein the at least one substrate comprises a first substrate and a second substrate oriented generally parallel to the first substrate.

5. The method according to claim 1 further comprising (f) heating the support at least in a furnace region located proximate an entry side of the substrate.

6. The method according to claim 1, further comprising (f) adjusting volume flow of the reaction gas so that friction between the support and the substrate is reduced by a flow of reaction gas exiting between the support and the substrate.

7. The method according to claim 1 further comprising (f) drawing off the reaction gas by applying suction above the support.

8. The method of claim 7, wherein the suction is provided by a plurality of exhaust openings disposed in at least one row oriented parallel to the direction of drawing-through.

9. The method of claim 8, wherein:
   the at least one substrate comprises a first substrate oriented parallel and in spaced to relation to a second substrate; and
   at least one row of exhaust openings is assigned to each substrate.

* * * * *